United States Patent
Sekiya et al.

(10) Patent No.: US 7,649,284 B2
(45) Date of Patent: Jan. 19, 2010

(54) HIGH-VOLTAGE PULSE GENERATING CIRCUIT

(75) Inventors: Takayuki Sekiya, Nissin (JP); Takeshi Sakuma, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 260 days.

(21) Appl. No.: 11/791,140

(22) PCT Filed: Nov. 25, 2005

(86) PCT No.: PCT/JP2005/021734

§ 371 (c)(1),
(2), (4) Date: May 21, 2007

(87) PCT Pub. No.: WO2006/057365

PCT Pub. Date: Jun. 1, 2006

(65) Prior Publication Data

US 2007/0296278 A1 Dec. 27, 2007

(30) Foreign Application Priority Data

Nov. 26, 2004 (JP) .............................. 2004-343023

(51) Int. Cl.
*H03K 4/00* (2006.01)
(52) U.S. Cl. ..................................................... 307/106
(58) Field of Classification Search ................. 307/106, 307/107
See application file for complete search history.

(56) References Cited

U.S. PATENT DOCUMENTS 5,910,738 A * 6/1999 Shinohe et al. ............. 327/108
7,084,528 B2 * 8/2006 Hatano et al. ............... 307/106

FOREIGN PATENT DOCUMENTS

| JP | A 62-172816 | 7/1987 |
|---|---|---|
| JP | A 1-288011 | 11/1989 |
| JP | A 4-125057 | 4/1992 |
| JP | A 10-52030 | 2/1998 |
| JP | A 2004-72994 | 3/2004 |

* cited by examiner

*Primary Examiner*—Albert W Paladini
*Assistant Examiner*—Michael Rutland Wallis
(74) *Attorney, Agent, or Firm*—Oliff & Berridge, PLC

(57) ABSTRACT

Disclosed is a high-voltage pulse generating circuit comprising an inductor, a first semiconductor switch and a second semiconductor switch connected in series between both ends of a DC power supply unit. A diode unit is connected between a gate terminal of the first semiconductor switch and one end of the inductor (namely, one end of a primary coil). A resistor is connected between the gate terminal of the first semiconductor switch and the one end of the inductor. The resistor serves as a gate current-supplying means which allows a gate current to flow to the first semiconductor switch when the second semiconductor switch is turned on.

6 Claims, 11 Drawing Sheets

HIGH-VOLTAGE PULSE GENERATING CIRCUIT

This application is based upon and claims the benefit of priority from Patent Application No. 2004-343023 filed on Nov. 26, 2004, in the Japanese Patent Office, of which the contents are incorporated herein by reference.

TECHNICAL FIELD

The present invention relates to a high-voltage pulse generating circuit formed with a simple circuit arrangement, for supplying a high-voltage pulse having an extremely short rise time and an extremely small pulse duration, by releasing electromagnetic energy which has been stored in an inductor from a low-voltage DC power supply unit.

BACKGROUND ART

Technologies for deodorization, sterilization, and toxic gas decomposition, based on a plasma developed by a high-voltage pulse discharge, have recently been put to use. To generate such a plasma, a high-voltage pulse generating circuit capable of supplying extremely narrow high voltage pulses is required.

There has heretofore been proposed a high-voltage pulse generating circuit, such as disclosed in Patent Document 1, for example. As shown in FIG. 10, the high-voltage pulse generating circuit 200 is formed with a simple circuit arrangement, including a transformer 204, a first semiconductor switch 206, and a second semiconductor switch 208, which are connected in series across a DC power supply unit 202. The first semiconductor switch 206 has an anode terminal connected to one end of a primary winding of the transformer, and wherein the other end thereof is connected to the cathode of a diode 210. The diode 210 further has an anode connected to the gate terminal of the first semiconductor switch 206.

When the second semiconductor switch 208 is turned on, the first semiconductor switch 206 is rendered conductive, thereby applying a voltage from the DC power supply unit 202 to the primary winding of the transformer 204, and storing induced energy in the transformer 204. When the second semiconductor switch 208 is thereafter turned on, since the first semiconductor switch 206 is quickly turned off, a sharply rising extremely narrow high-voltage pulse Po is developed across the secondary winding of the transformer 204. Therefore, the high-voltage pulse Po appears between the output terminals 212, 214 of the transformer 204.

The high-voltage pulse generating circuit 200 has a simple circuit arrangement, which is capable of supplying a high-voltage pulse Po having a sharp rise time and an extremely short pulse duration, without requiring a plurality of semiconductor switches to which high voltages are applied.

Patent Document 1: Japanese Laid-Open Patent Publication No. 2004-72994

DISCLOSURE OF THE INVENTION

In order for the high-voltage pulse generating circuit 200 to output stable high-voltage pulses, the first semiconductor switch 206 needs to achieve a stable turned-on state.

As indicated by the waveform 220 in FIG. 11, a stable turned-on state occurs when an anode-to-cathode voltage $V_{AK}$ of the first semiconductor switch 206 quickly drops at a stage when the second semiconductor switch 208 is turned on, thereby quickly turning on the first semiconductor switch 206.

With the high-voltage pulse generating circuit 200, however, if the power supply voltage Vdc of the DC power supply unit 202 is low, or the time for which the first semiconductor switch 206 remains turned on (set on-time) is short, then the first semiconductor switch 206 may fail to achieve a stable turned-on state.

Specifically, if almost no gate current flows into the gate terminal of the first semiconductor switch 206, and further if the power supply voltage Vdc of the DC power supply unit 202 is low, or the time for which the first semiconductor switch 206 remains turned on (set on-time) is short, then as indicated by the waveforms 222 or 224 in FIG. 11, the anode-to-cathode voltage $V_{AK}$ of the first semiconductor switch 206 drops gradually, wherein the degree at which the voltage drops varies within each cycle.

Therefore, if the exciting inductance of the transformer 204 is low, then since the set on-time of the first semiconductor switch 206 is a short value, the output period arrives while the first semiconductor switch 206 is still in an unstable on-time, resulting in a failure to output a stable high-voltage pulse Po. The same problem also occurs if the power supply voltage Vdc of the DC power supply unit 202 is low.

It is an object of the present invention to provide a high-voltage pulse generating circuit, which is formed with a simple circuit arrangement and which is capable of allowing a first semiconductor switch to achieve a stable on-state. Further, the high-voltage pulse generating circuit is lower in cost and has a small size, and can meet both higher-frequency and larger-power requirements. The high-voltage pulse generating circuit is provided as a result of further improving the above high-voltage pulse generating circuit.

A high-voltage pulse generating circuit according to the present invention includes an inductor, a first semiconductor switch, and a second semiconductor switch, which are connected in series with each other between opposite ends of a DC power supply unit, a diode having a cathode terminal thereof connected to another end of the inductor, the inductor having one end thereof connected to an anode terminal of the first semiconductor switch, and the diode having an anode terminal thereof connected to a gate terminal of the first semiconductor switch, and a gate current supply means for supplying a gate current from the DC power supply unit to the gate terminal of the first semiconductor switch, based on turning on the second semiconductor switch.

Since the gate current flows from the gate current supply means to the first semiconductor switch as a result of turning on the second semiconductor switch, when the second semiconductor switch is turned on, the anode-to-cathode voltage of the first semiconductor switch quickly drops, thereby quickly turning on the first semiconductor switch. Therefore, the first semiconductor switch is maintained in a stable turned-on state.

According to the present invention, therefore, the first semiconductor switch is held in a stable turned-on state with a simple circuit arrangement, enabling the high-voltage pulse generating circuit to stably output a high-voltage pulse having an extremely short rise time and an extremely small pulse duration. It is also possible to reduce the time during which the second semiconductor switch is turned on, so that the high-voltage pulse can be generated at a higher frequency.

In the above arrangement, the gate current supply means further includes a resistor connected between the other end of the inductor and the gate terminal of the first semiconductor switch. When the second semiconductor switch is turned on, the power supply voltage of the DC power supply unit is applied to the resistor, thereby causing the gate current to flow between the gate and cathode of the first semiconductor switch. Consequently, the first semiconductor switch is quickly shifted so as to assume a turned-on state. The gate current supply means may also include a parallel-connected circuit, made up of a resistor and a capacitor, connected between the other end of the inductor and the gate terminal of the first semiconductor switch.

The above arrangement may also comprise another power supply, which is different from the DC power supply unit, wherein the other power supply provides a power supply voltage that is lower than the power supply voltage of the DC power supply unit. The gate current supply means is connected between the other power supply and the gate terminal of the first semiconductor switch. Specifically, the gate current supply means comprises a resistor connected between the other power supply and the gate terminal of the first semiconductor switch.

Current flows through the resistor while the second semiconductor switch is turned on. During that time, losses which are proportional to the square of the applied voltage occur at the resistor. Therefore, if the gate current supply means is supplied with electric power through the other power supply, whose power supply voltage is lower than the power supply voltage of the DC power supply unit, losses caused by the resistor can be reduced. Thus, the high-voltage pulse generating circuit may be reduced in cost and size, while being increased in frequency and power. The other power supply may comprise a power supply (IC power supply), which is used by an IC for energizing the second semiconductor switch. Alternatively, the other power supply may be an external power supply.

In the above arrangement, the gate current supply means may include a parallel-connected circuit, made up of a resistor and a capacitor, connected between the other power supply and the gate terminal of the first semiconductor switch. The parallel-connected circuit operates in the same manner as a differentiating circuit. In the current waveform output from the parallel-connected circuit, the current value rises sharply at the instant that the second semiconductor switch is turned on. Further, the current is about 10 times greater than the current value that would be produced if only the resistor were connected. When the gate current having the above current waveform is supplied to the first semiconductor switch, the first semiconductor switch is shifted more quickly into a turned-on state. Even when the power supply voltage of the IC power supply is lowered, since the peak current value of the gate current can be increased instantaneously, the first semiconductor switch can still be maintained in a stable turned-on state.

The above arrangement may further have another power supply, which is different from the DC power supply unit, wherein the other power supply provides a power supply voltage that is lower than the power supply voltage of the DC power supply unit, and wherein the gate current supply means includes a transistor connected between the other power supply and the gate terminal of the first semiconductor switch. A control circuit is provided for turning on the transistor substantially in synchronism with turning on the second semiconductor switch, and for controlling the gate current value thereof.

The instant that the second semiconductor switch is turned on, the transistor supplies a current controlled thereby to the gate terminal of the first semiconductor switch. Similar to the arrangement in which the resistor and the capacitor are connected, as a result of the current waveform that flows into the gate terminal of the first semiconductor switch, the current value rises sharply at the same instant that the second semiconductor switch is turned on, and the current value is about 10 times greater than the current value that would be produced if only the resistor were connected.

The above arrangement may further have a rectifying device connected between the gate current supply means and a junction formed between the gate terminal of the first semiconductor switch and an anode terminal of the diode, wherein the rectifying device has a forward direction oriented toward the junction. When the second semiconductor switch is turned off, current flowing through the inductor circulates in a route from the anode terminal to the gate terminal of the first semiconductor switch and toward the diode, thereby shifting the first semiconductor switch so as to assume a turned-off state. Further, when the gate current supply means is connected between the first semiconductor switch and the other power supply, the circulating current flows into the gate current supply means, depending on a potential relationship between the components. As a result, the first semiconductor switch is not shifted into a turned-off state. When the rectifying device is connected, the circulating current is prevented from flowing into the gate current supply means. Therefore, the first semiconductor switch is stably shifted into a turned-on state, with the result that the high-voltage pulse generating circuit can output a stable high-voltage pulse.

As described above, the high-voltage pulse generating circuit according to the present invention is formed with a simple circuit arrangement and is capable of allowing the first semiconductor switch to achieve a stable on-state. Further, the high-voltage pulse generating circuit is both lower in cost and smaller in size, while meeting both higher-frequency and larger-power requirements.

BEST MODE FOR CARRYING OUT THE INVENTION

Embodiments of high-voltage pulse generating circuits according to the present invention shall be described below with reference to FIGS. 1 through 9.

Figure 1:
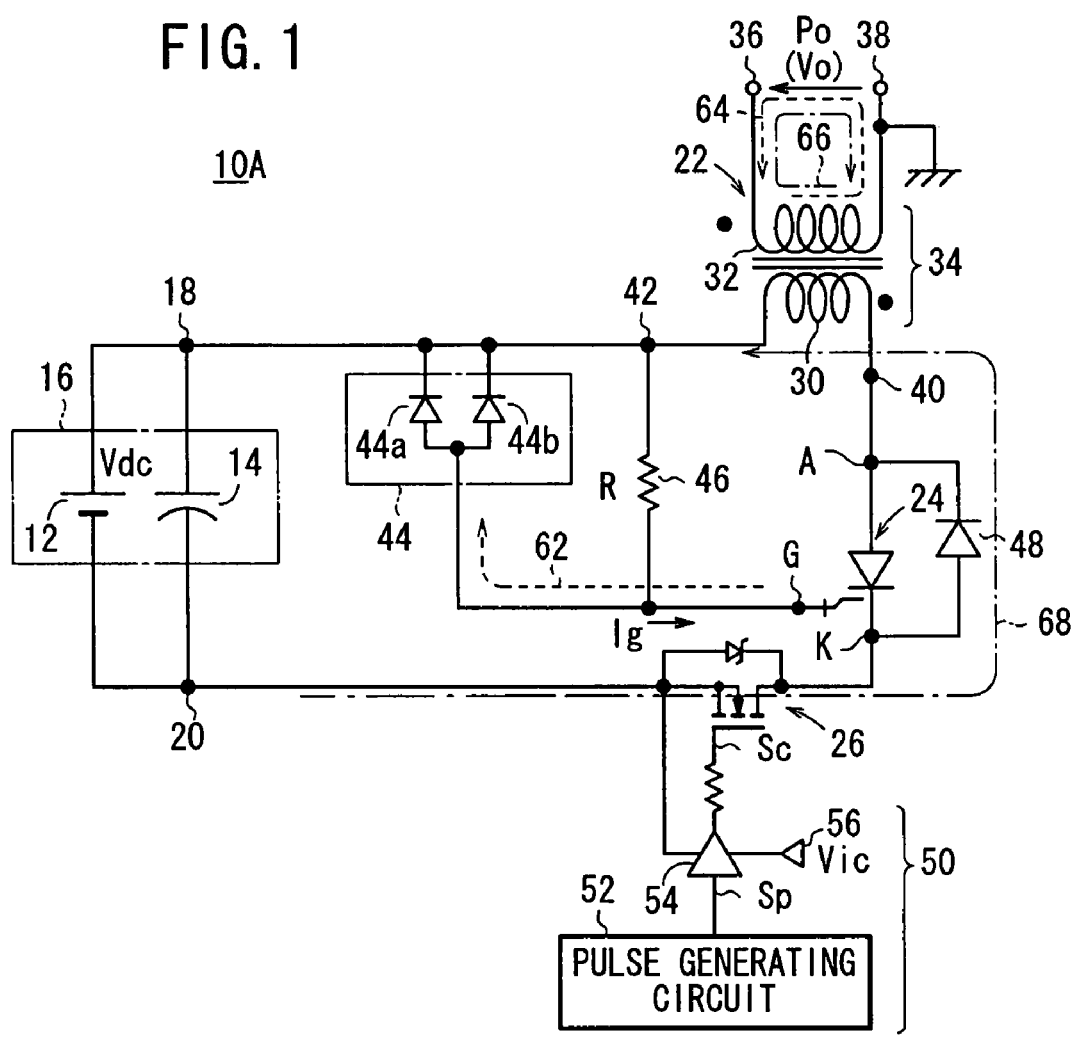
FIG. 1 is a circuit diagram showing an arrangement of a high-voltage pulse generating circuit according to a first embodiment of the present invention.

As shown in FIG. 1, a high-voltage pulse generating circuit 10A according to a first embodiment of the present invention includes an inductor 22, a first semiconductor switch 24, and a second semiconductor switch 26, which are connected in series oppositely across terminals 18, 20 of a DC power supply unit 16 having a DC power supply 12 (power supply voltage Vdc) and a capacitor 14 which lowers high-frequency impedance.

The inductor 22 comprises a transformer 34 having a primary winding 30 and a secondary winding 32, and produces a high-voltage pulse Po between opposite ends 36, 38 (output terminals) of the secondary winding 32 of the transformer 34. Although not shown, a resistive load or a capacitive load is connected to the output terminals 36, 38 of the secondary winding 32. The first semiconductor switch 24 includes an anode terminal connected to an end 40 of the inductor 22 (an end of the primary winding 30).

A diode assembly 44 is connected between a gate terminal G of the first semiconductor switch 24 and the other end 42 of the inductor 22 (the other end of the primary winding 30). The diode assembly 44 includes two parallel diodes 44a and 44b, having respective anode terminals connected to the gate terminal G of the first semiconductor switch 24.

A resistor 46 is connected between the gate terminal G of the first semiconductor switch 24 and the other end 42 of the inductor 22.

A diode 48 is connected in parallel with the first semiconductor switch 24. The diode 48 has an anode terminal and a cathode terminal connected respectively to the cathode terminal and the anode terminal of the first semiconductor switch 24. Therefore, the diode 48 is connected in an anti-parallel relation to the first semiconductor switch 24.

In FIG. 1, the second semiconductor switch 26 is connected to the negative terminal 20 of the DC power supply unit 16. However, the second semiconductor switch 26 may also be connected to the positive terminal 18 of the DC power supply unit 16, and thereby provide the same advantages. An output voltage of the high-voltage pulse generating circuit 10A may be extracted from across the first semiconductor switch 24, rather than from the inductor 22.

The second semiconductor switch 26 comprises a self-extinguishing or commutation-extinguishing device. In the illustrated embodiment, the second semiconductor switch 26 comprises a power metal oxide semiconductor field-effect transistor, incorporating an avalanche diode connected in an anti-parallel relation thereto. A drive circuit 50 supplies a control signal Sc between the gate and source terminals of the second semiconductor switch 26. The drive circuit 50 includes a pulse generating circuit 52 for generating a pulse signal Sp, for thereby turning on and off the second semiconductor switch 26, and an amplifier 54 for amplifying pulse signals Sp that are output from the pulse generating circuit 52, so as to form the control signal Sc. An IC power supply 56 (e.g., a power supply voltage+15 V) is connected to the positive power supply terminal of the amplifier 54, and the second semiconductor switch 26 further has a source terminal connected to the negative power supply terminal of the amplifier 54.

The first semiconductor switch 24 comprises either a current-controlled device, or a self-extinguishing or commutation-extinguishing device. In the illustrated embodiment, the first semiconductor switch 24 comprises an SI thyristor, which is highly resistant to a voltage increasing ratio (dv/dt) when it is turned off, and which has a high voltage rating.

Figure 2A:
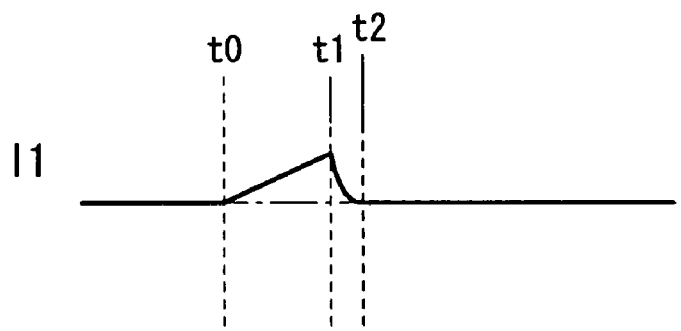
FIGS. 2A through 2C are diagrams showing operating waveforms of voltages and currents in the high-voltage pulse generating circuit according to the first embodiment of the present invention.
Figure 2B:
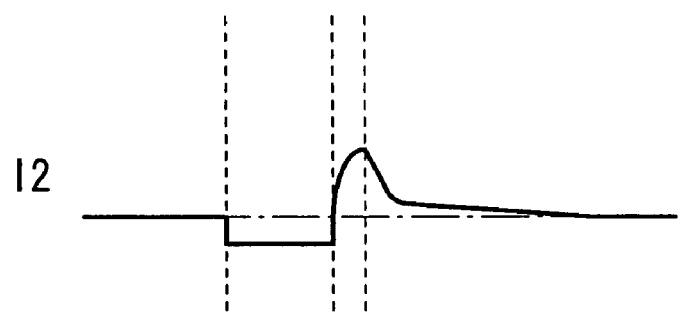
Figure 2C:
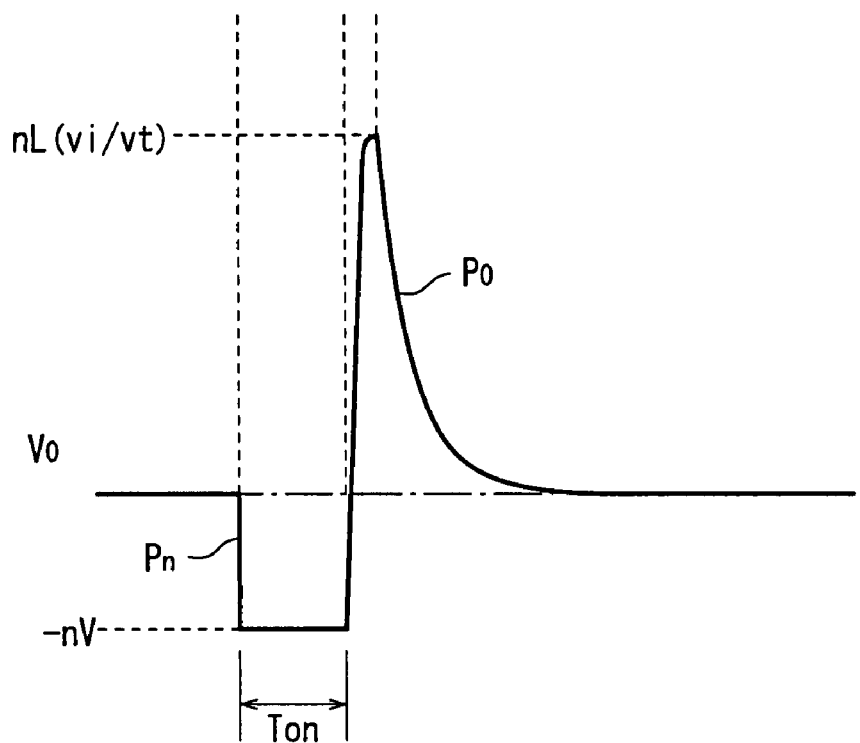
Figure 3:
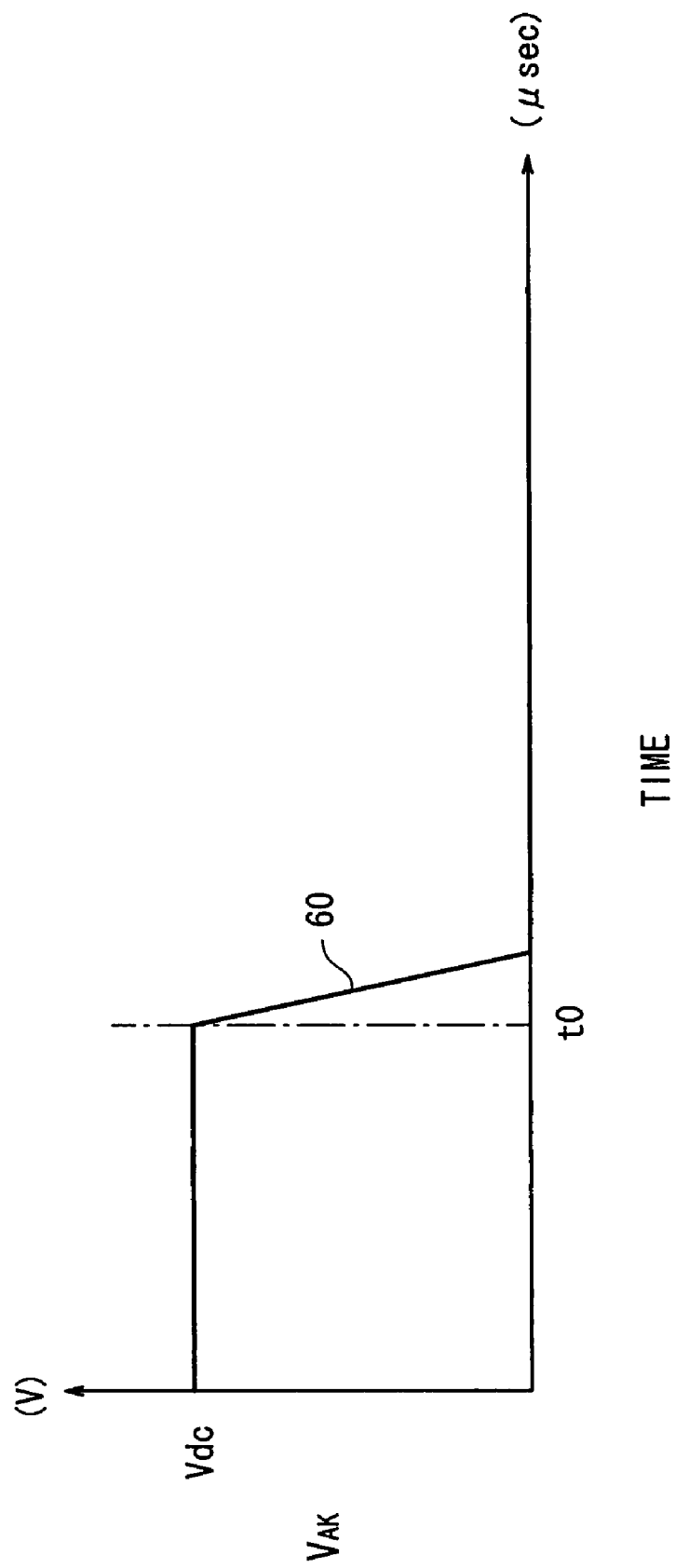
FIG. 3 is a waveform diagram showing a change in the anode-to-cathode voltage of a first semiconductor switch, at a stage in which a second semiconductor switch is turned on, in the high-voltage pulse generating circuit according to the first embodiment of the present invention.

Operation of the high-voltage pulse generating circuit 10A according to the first embodiment shall be described below with reference to the circuit diagram shown in FIG. 1 and the waveform diagrams shown in FIGS. 2A through 2C.

At time t0, a control signal Sc is supplied between the gate and source of the second semiconductor switch 26, thereby turning on the second semiconductor switch 26.

At this time, the power supply voltage Vdc of the DC power supply unit 16 is applied to the resistor 46, which is connected between the other end 42 of the inductor 22 and the gate terminal G of the first semiconductor switch 24, thus causing a gate current Ig to flow between the gate and cathode of the first semiconductor switch 24. If the gate current is represented by Ig, the power supply voltage by Vdc, and the resistance value of the resistor by R, then the gate current Ig is expressed by:

$$Ig=Vdc/R$$

When the gate current Ig flows between the gate and cathode of the first semiconductor switch 24, the first semiconductor switch 24 quickly assumes a turned-on state. Specifically, as indicated by the waveform 60 in FIG. 3, when the second semiconductor switch 26 is turned on, the anode-to-cathode voltage $V_{AK}$ of the first semiconductor switch 24 quickly drops, causing the first semiconductor switch 24 to quickly assume a turned-on state. Consequently, the resistor 46 functions as a gate current supply means, for supplying the gate current Ig to the first semiconductor switch 24, as a result of turning on the second semiconductor switch 26.

When the second semiconductor switch 26 and the first semiconductor switch 24 are turned on at time t0, a voltage, which is the same as the voltage Vdc of the DC power supply unit 16, is applied to the transformer 34. Assuming the primary inductance of the transformer 34 is represented by L, then a current I1 flowing through the primary winding 30 of the transformer 34 linearly increases at a gradient (V/L) with respect to time, as shown in FIG. 2A.

Within the period Ton, during which the first semiconductor switch 24 is turned on, a constant negative-polarity voltage (negative pulse Pn) is output between the output terminals 36, 38 of the secondary winding 32. Assuming the power supply voltage of the DC power supply unit 16 is represented by Vdc, and the turn ratio of the transformer 34 (the number of turns n2 in the secondary winding 32/the number of turns n1 in the primary winding 30) is represented by n, then the level of the output voltage V0 appearing between the output terminals 36, 38 of the secondary winding 32 is represented by −nV (Vo=−nV). Thus, within the period Ton, the current I2 flowing through the secondary winding 32 has a waveform that is similar to that of the negative pulse Pn (see FIG. 2B).

Thereafter, at time t1, the control signal Sc stops being supplied between the gate and the source of the second semiconductor switch 26. Hence, the second semiconductor switch 26 is turned off, whereupon the current from the cathode of the first semiconductor switch 24 is reduced to zero, i.e., the first semiconductor switch 24 is opened. Therefore, the current I1 flowing through the primary winding 30 is cut off, and the primary winding 30 generates a reverse induced voltage based on the remaining electromagnetic energy therein. Due to the diodes 44a, 44b of the diode assembly 44, the current I1 that has flowed through the primary winding 30 flows in a path 62 (indicated by the broken line) extending from the anode terminal A of the first semiconductor switch 24, to the gate terminal G of the first semiconductor switch 24, to the anodes of the diodes 44a, 44b, and to the cathodes of the diodes 44a, 44b. At this time, a high-voltage pulse Po starts to be generated between the output terminals 36 and 38, and the output voltage V0 sharply rises due to the electromotive force induced by the transformer 34.

When the carriers in the first semiconductor switch 24 are eliminated by the circulative flow of the current in the path 62, the first semiconductor switch 24 quickly assumes a turned-off state. When the first semiconductor switch 24 is turned off and the current I1 is reduced to zero at time t2, the high-voltage pulse Po is at its peak.

The peak value of the high-voltage pulse Po is expressed by nL1 (di/dt), where n represents the turn ratio of the transformer 34, L represents the primary inductance of the transformer 34, and (di/dt) is the cut off rate of the current I1 flowing through the primary winding 30 of the transformer 34. Assuming that the anode-to-cathode voltage of the first semiconductor switch 24 is represented by $V_{AK}$, then the peak value of the high-voltage pulse Po is represented by $nV_{AK}$, which is higher than the resistance acting against the anode-to-cathode voltage $V_{AK}$ of the first semiconductor switch 24. Further, assuming that the equivalent capacitance of the electric capacitance of the first semiconductor switch 24 is represented by C, then the pulse duration Tp of the high-voltage pulse Po is expressed by the following equation:

$$Tp \approx \pi\sqrt{LC}$$

When the first semiconductor switch 24 is turned off, the current flowing through the exciting inductance of the inductor 22 flows into a load (not shown) connected between the output terminals 36, 38 and through the inductor 22 (see the path 64 indicated by the broken line). At this time, a large pulse voltage is generated across the inductor 22, thereby producing an electric discharge across the load (e.g., a discharge gap).

In the high-voltage pulse generating circuit 10A according to the first embodiment, as described above, since the gate current Ig flows through the resistor 46 and into the gate terminal G of the first semiconductor switch 24 as a result of turning on the second semiconductor switch 26, when the second semiconductor switch 26 is turned on, the anode-to-cathode voltage $V_{AK}$ of the first semiconductor switch 24 quickly drops, thereby quickly turning on the first semiconductor switch 24. Therefore, the first semiconductor switch 24 is maintained in a stable turned-on state.

According to the first embodiment, therefore, the first semiconductor switch 24 is maintained in a stable turned-on state using a simple circuit arrangement, thus enabling the high-voltage pulse generating circuit to stably output a high-voltage pulse Po having an extremely short rise time and an extremely small pulse duration. It is also possible to reduce the time during which the second semiconductor switch 26 is turned on (on-time Ton), so that the high-voltage pulse Po can be generated at a higher frequency. Although not shown, a capacitor may also be connected in parallel with the resistor 46.

Since general semiconductor switches, including the first semiconductor switch 24, have a parasitic capacitive component, not all of the current flowing into the path 62 flows into the load, but some of the current flows so as to charge the parasitic capacitance of the first semiconductor switch 24.

If the load is a capacitive load, such as a discharge gap, then energy is consumed by the discharge. However, not all of the energy may be consumed, or a large amount of such energy may remain unconsumed since no discharge occurs.

In this case, the remaining charge is discharged through an exciting inductance of the inductor 22 (i.e., current flows into the exciting inductance of the inductor 22), so that the energy becomes shifted again, resulting in the exciting inductance of the inductor 22.

When the charge stored in the load is eliminated, and the energy is completely shifted again into the exciting inductance, currents flow through two paths (i.e., first and second paths 66, 68 indicated by the dot-and-dash lines).

The first path 66 is directed again toward the load, whereas the second path 68 forms a path interconnecting the DC power supply unit 16, the diode that is held in an anti-parallel connection with the second semiconductor switch 26, and the diode 48 that is held in an anti-parallel connection with the first semiconductor switch 24.

The voltage generated across the inductor 22 at this time is clamped as a result of the voltage generated by the DC power supply unit 16, the diode connected in an anti-parallel relation with the second semiconductor switch 26, and the diode 48 connected in an anti-parallel relation with the first semiconductor switch 24, whereby a large amount of the current flows through the second path 68. The flow of current through the second path 68 provides a regenerative action, so as to regenerate the energy remaining in the capacitor 14 of the DC power supply unit 16.

In other words, the flow of current through the second path 68 acts to return excessive energy from the load (unconsumed energy) to the DC power supply unit 16, thus contributing to an increase in the efficiency of the DC power supply unit 16.

If the diode 48 were dispensed with, then the exciting inductance of the inductor 22 and the load would resonate with each other, possibly resulting in application of a reverse voltage, in excess of the withstand voltage, to the first semiconductor switch 24, and thus posing adverse effects, such as erroneous operation of the second semiconductor switch 26 due to added pulsed noise. Therefore, it is desirable to keep the diode 48 connected, in order to process the energy of the exciting inductance.

A high-voltage pulse generating circuit 10B according to a second embodiment shall be described below with reference to FIG. 4. Parts of the second embodiment that correspond to those of the first embodiment are designated using identical reference characters, and descriptions of such features shall not be provided below.

Figure 4:
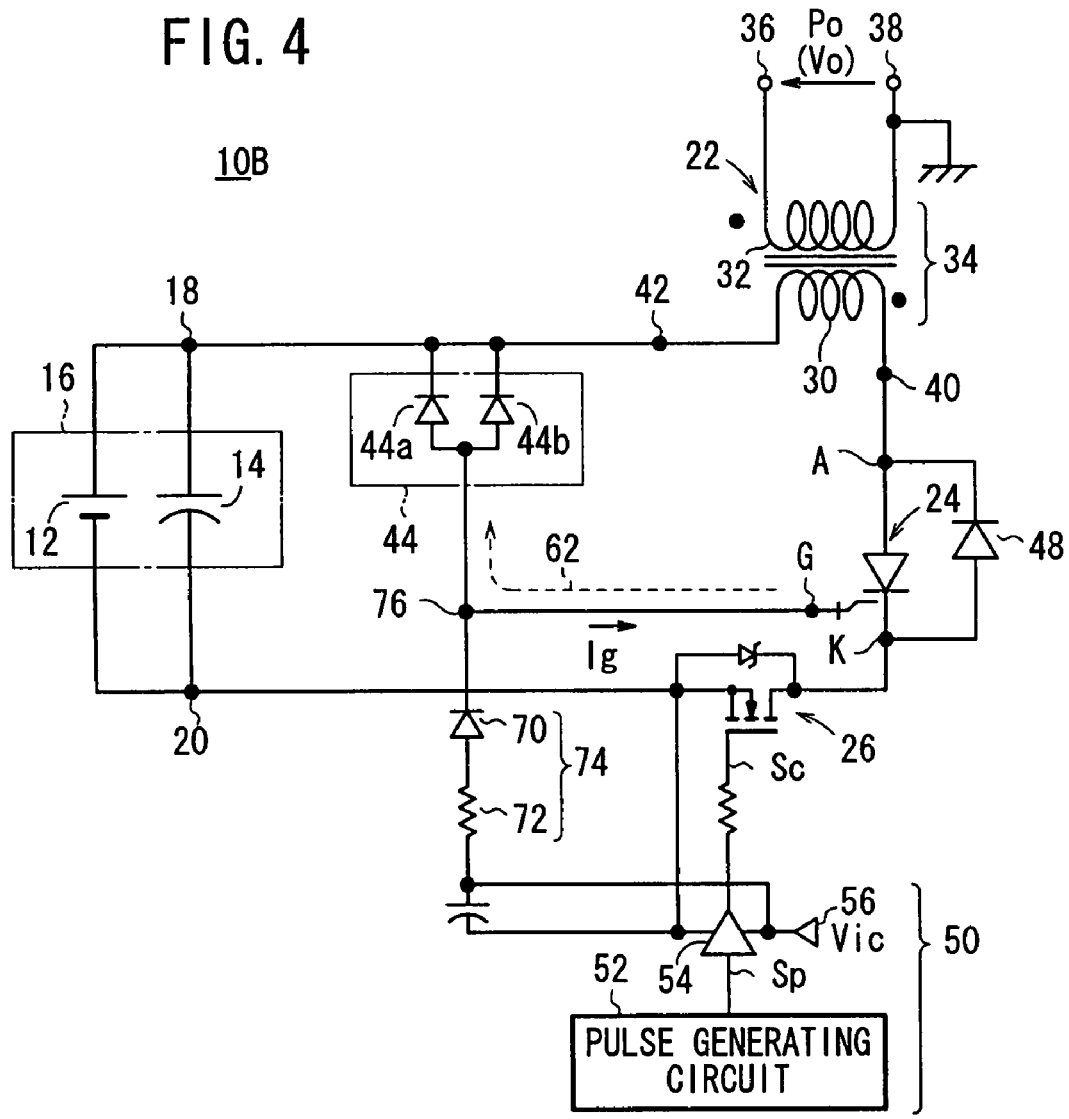
FIG. 4 is a circuit diagram showing an arrangement of a high-voltage pulse generating circuit according to a second embodiment of the present invention.

As shown in FIG. 4, the high-voltage pulse generating circuit 10B according to the second embodiment has essentially the same arrangement as that of the high-voltage pulse generating circuit 10A according to the first embodiment described above, except that a series-connected circuit 74, made up of a diode 70 and a resistor 72, is connected between the IC power supply 56 and the gate terminal G of the first semiconductor switch 24.

As shown in FIG. 4, the series-connected circuit 74, made up of the diode 70 and the resistor 72, is connected between the IC power supply 56 and a junction 76 formed between the diode assembly 44 and the gate terminal G of the first semiconductor switch 24. In particular, the diode 70 is connected to the junction 76, and the resistor 72 is connected to the IC power supply 56. The diode 70 is arranged such that the cathode thereof is connected to the junction 76 and the anode thereof is connected to the resistor 72.

A comparison between the high-voltage pulse generating circuit 10A according to the first embodiment and the high-voltage pulse generating circuit 10B according to the second embodiment shall be described below.

In the high-voltage pulse generating circuit 10A according to the first embodiment, the resistor 46 is connected between the other end 42 of the inductor 22 and the gate terminal G of the first semiconductor switch 24. Therefore, a loss W1on caused by the resistor 46 while the second semiconductor switch 26 is turned on can be expressed by the following equation:

$$W1on = D \times Vdc^2/R$$

where D represents the duty cycle of the pulse signal Sp output from the pulse generating circuit 52, Vdc represents the power supply voltage of the DC power supply unit 16, and R represents the resistance value of the resistor 46. In a specific example, if the power supply voltage Vdc is 150 V, the duty cycle of the pulse signal Sp is 0.1, and a gate current Ig of 0.3 A is supplied, then the loss caused by the resistor 46 may be expressed as follows:

$$W1on = 0.1 \times 150^2/(150/0.3) = 4.5 \text{ W}$$

In the high-voltage pulse generating circuit 10B according to the second embodiment, the resistor 72 is connected between the IC power supply 56 and the gate terminal G of the first semiconductor switch 24. Therefore, the loss W2 on caused by the resistor 72 while the second semiconductor switch 26 is turned on can be expressed by the following equation:

$$W2on = D \times Vic^2/R$$

where D represents the duty cycle of the pulse signal Sp output from the pulse generating circuit 52, Vic represents the power supply voltage of the IC power supply 56, and R represents the resistance value of the resistor 72. In a specific example, if the power supply voltage Vic is 15 V, the duty cycle of the pulse signal Sp is 0.1, and a gate current Ig of 0.3 A is supplied, then the loss caused by the resistor 72 may be expressed as follows:

$$W2on = 0.1 \times 15^2/(15/0.3) = 0.45 \text{ W}$$

Therefore, the loss caused by the resistor 72 of the high-voltage pulse generating circuit 10B according to the second embodiment is only 1/10 of the loss according to the first embodiment.

Since the loss caused by the resistor 72 of the high-voltage pulse generating circuit 10B according to the second embodiment is small, the high-voltage pulse generating circuit 10B can be reduced in cost and size, while also being increased in frequency and power.

As described above, when the second semiconductor switch 26 is turned off, current flowing through the inductor 22 circulates in a path 62 extending from the anode terminal A of the first semiconductor switch 24, to the gate terminal G and to the diode assembly 44, thereby causing the first semiconductor switch 24 to be shifted so as to assume a turned-off state. When the resistor 72 is connected between the first semiconductor switch 24 and the IC power supply 56, the circulating current may flow into the resistor 72, depending on the potential relationship between the components. As a result, the first semiconductor switch 24 may not be shifted and assume a turned-off state, or the voltage of the IC power supply 56 may change greatly, possibly causing the IC to operate erroneously, or causing an overvoltage to be applied to the IC power supply 56. Thus, the IC could possibly become broken.

However, according to the present embodiment, since the diode 70 is connected between the junction 76 and the resistor 72, the circulating current is prevented from flowing into the resistor 72. Therefore, the voltage of the IC power supply 56 is not changed, and the first semiconductor switch 24 is stably shifted so as to assume a turned-on state. Accordingly, the high-voltage pulse generating circuit can output a stable high-voltage pulse Po.

A high-voltage pulse generating circuit 10C according to a third embodiment shall be described below with reference to FIG. 5.

Figure 5:
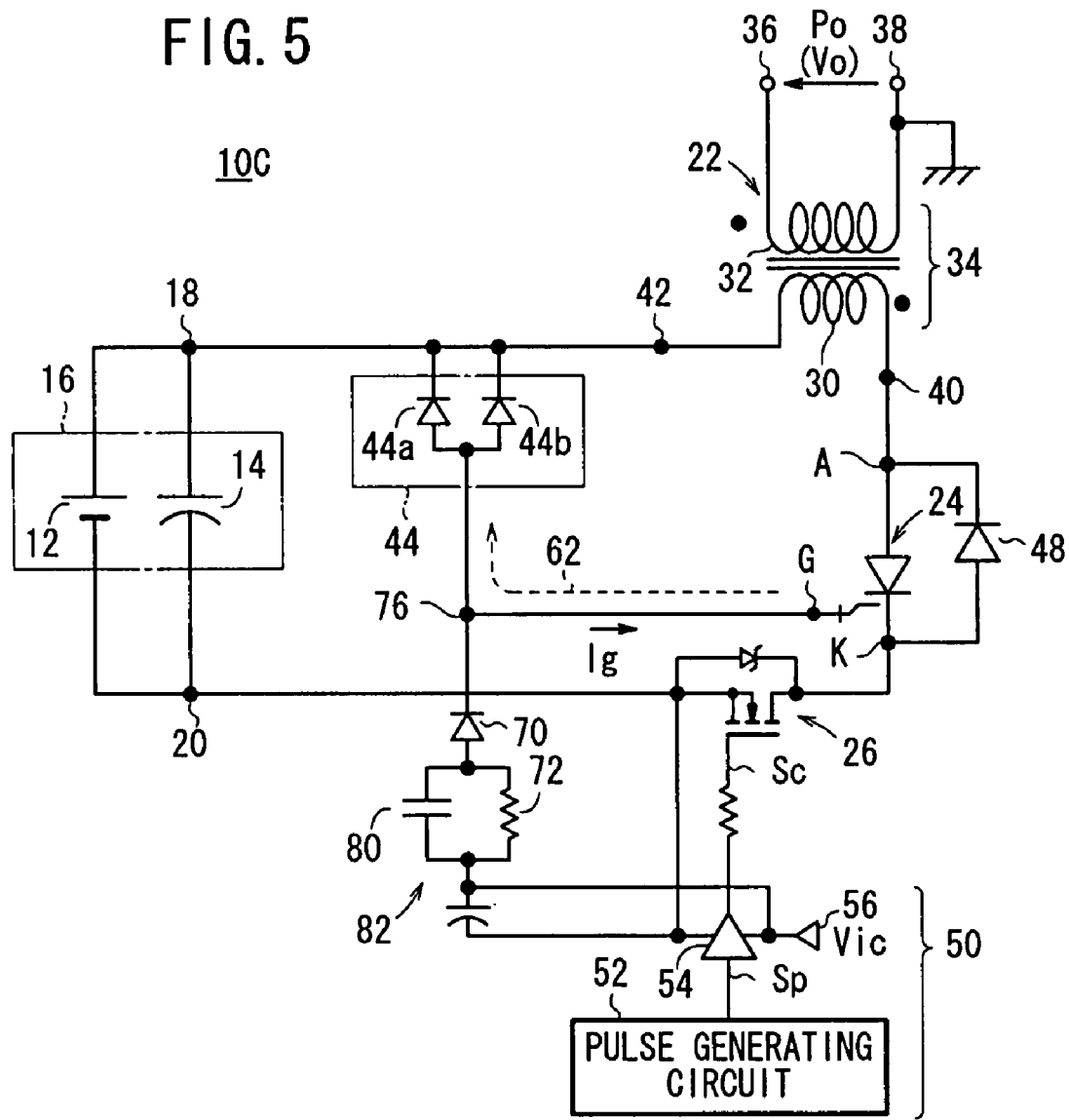
FIG. 5 is a circuit diagram showing an arrangement of a high-voltage pulse generating circuit according to a third embodiment of the present invention.

As shown in FIG. 5, the high-voltage pulse generating circuit 10C according to the third embodiment has essentially the same arrangement as that of the high-voltage pulse generating circuit 10B according to the second embodiment described above, except that a parallel-connected circuit 82, made up of a resistor 72 and a capacitor 80, is connected instead of solely the resistor 72.

Figure 6:
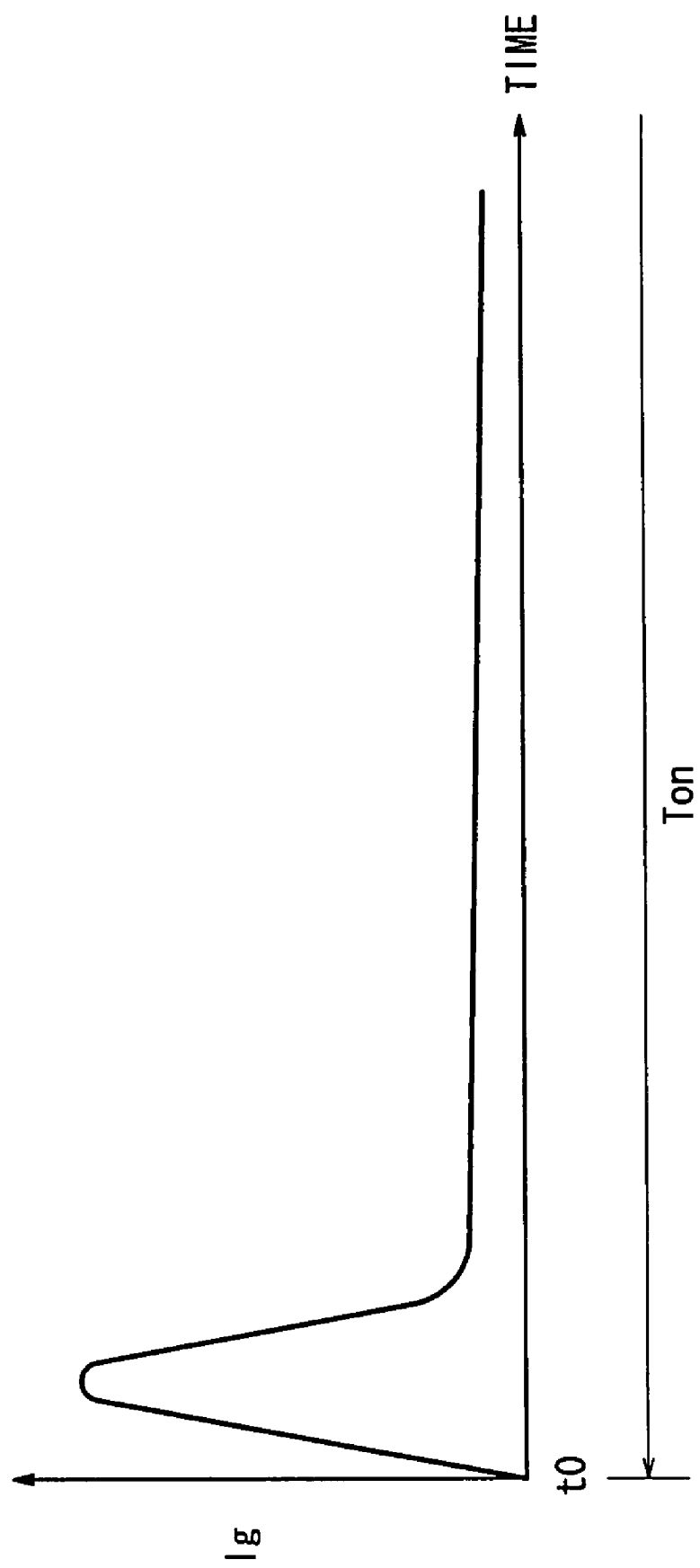
FIG. 6 is a waveform diagram showing a gate current flowing into the gate terminal of a first semiconductor switch, at a stage in which a second semiconductor switch is turned on, in the high-voltage pulse generating circuit according to the third embodiment of the present invention.

The parallel-connected circuit 82 operates in the same manner as a differentiating circuit. According to the current waveform output from the parallel-connected circuit 82 (i.e., the waveform of the gate current Ig) as shown in FIG. 6, the current value sharply rises the instant that the second semiconductor switch 26 is turned on (time t0).

Further, the current value is about 10 times greater than the current value that would be produced if only the resistor 72 were connected (see the high-voltage pulse generating circuit 10B according to the second embodiment).

When the gate current Ig having the above current waveform is supplied to the first semiconductor switch 24, the first semiconductor switch 24 is more quickly shifted so as to assume a turned-on state. Even if the power supply voltage Vic of the IC power supply 56 is lowered, or if a power supply is connected that has a TTL level (3.3 V to 5 V) connected to a logic circuit, since the peak current value of the gate current Ig can be increased instantaneously, the first semiconductor switch 24 can still be maintained in a stable turned-on state.

A high-voltage pulse generating circuit 10D according to a fourth embodiment shall be described below with reference to FIG. 7.

Figure 7:
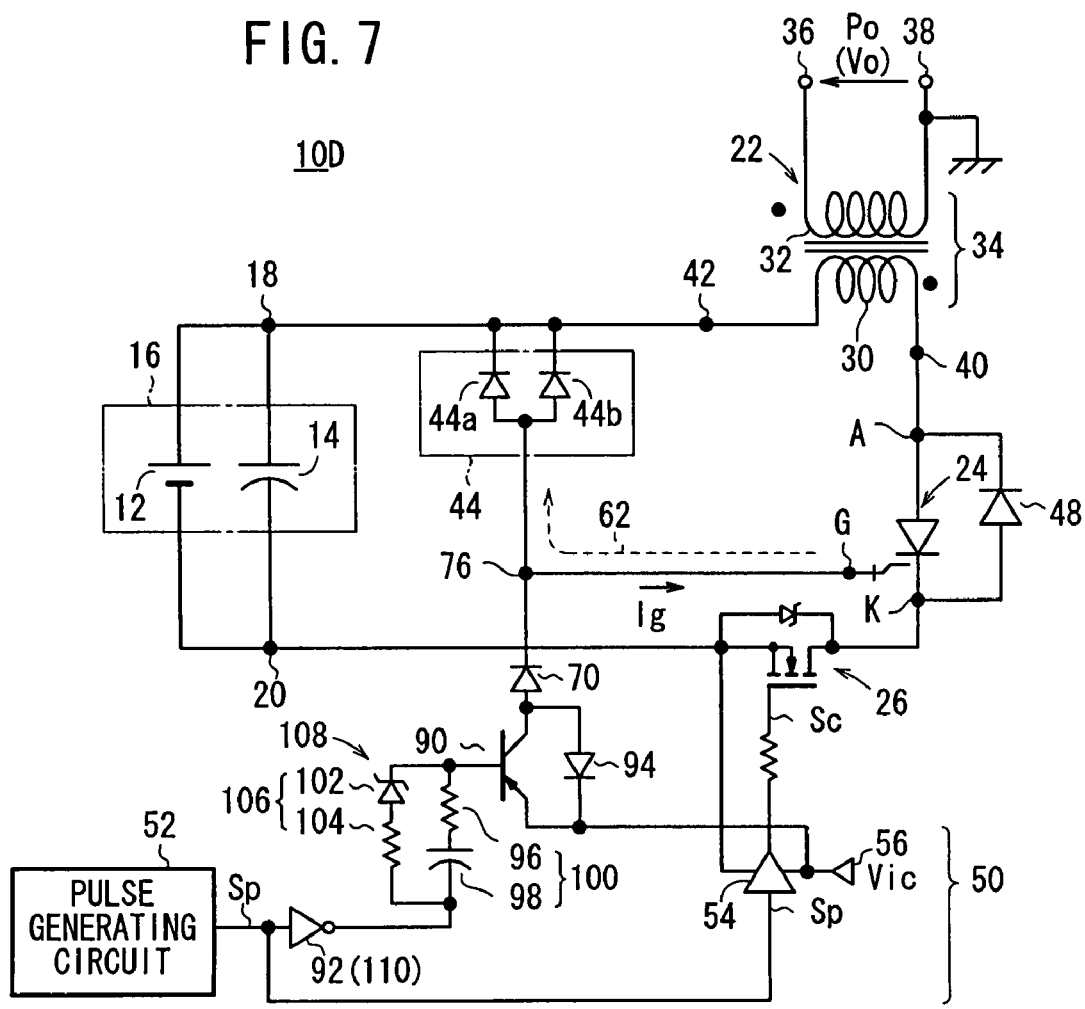
FIG. 7 is a circuit diagram showing an arrangement of a high-voltage pulse generating circuit according to a fourth embodiment of the present invention.

As shown in FIG. 7, the high-voltage pulse generating circuit 10D according to the fourth embodiment has essentially the same arrangement as that of the high-voltage pulse generating circuit 10B according to the second embodiment described above, except that a pnp transistor 90, for example, is connected between the IC power supply 56 and the gate terminal G of the first semiconductor switch 24. In addition, the high-voltage pulse generating circuit 10D comprises a control circuit 92 for turning on the pnp transistor 90 substantially in synchronism with turning on the second semiconductor switch 26, and a diode 94 is connected between the collector and emitter of the pnp transistor 90.

A parallel-connected circuit 108, made up of a series-connected circuit 100 formed by a resistor 96 and a capacitor 98 and another series-connected circuit 106 formed by a zener diode 102 and a resistor 104, is connected between the output terminal of the control circuit 92 and the base terminal of the pnp transistor 90. The IC power supply 56 is connected to the emitter terminal of the pnp transistor 90, and further, the gate terminal G of the first semiconductor switch 24 is connected to the collector terminal of the pnp transistor 90 through the diode 70.

The control circuit 92 comprises an inverter 110 for outputting an inverted signal of the pulse signal Sp from the pulse generating circuit 52. Further, the control circuit may comprise a differentiating circuit (not shown) for outputting a differentiated waveform of the pulse signal Sp.

Substantially simultaneously with the rise time of the pulse waveform output from the amplifier 54, a voltage lower than the potential of the emitter terminal of the pnp transistor 90 is applied to the base terminal of the pnp transistor 90. Therefore, the pnp transistor 90 is turned on, for supplying current from the IC power supply 56, as a gate current Ig amplified by the pnp transistor 90, to the gate terminal G of the first semiconductor switch 24. The capacitor 98, which is connected to the base of the pnp transistor 90, supplies a differentiated base current to the base, whereby the emitter of the pnp transistor 90 supplies an amplified large differentiated current to the collector. In this manner, the first semiconductor switch 24 also quickly is shifted so as to assume a turned-on state.

A high-voltage pulse generating circuit 10E according to a fifth embodiment shall be described below with reference to FIG. 8.

Figure 8:
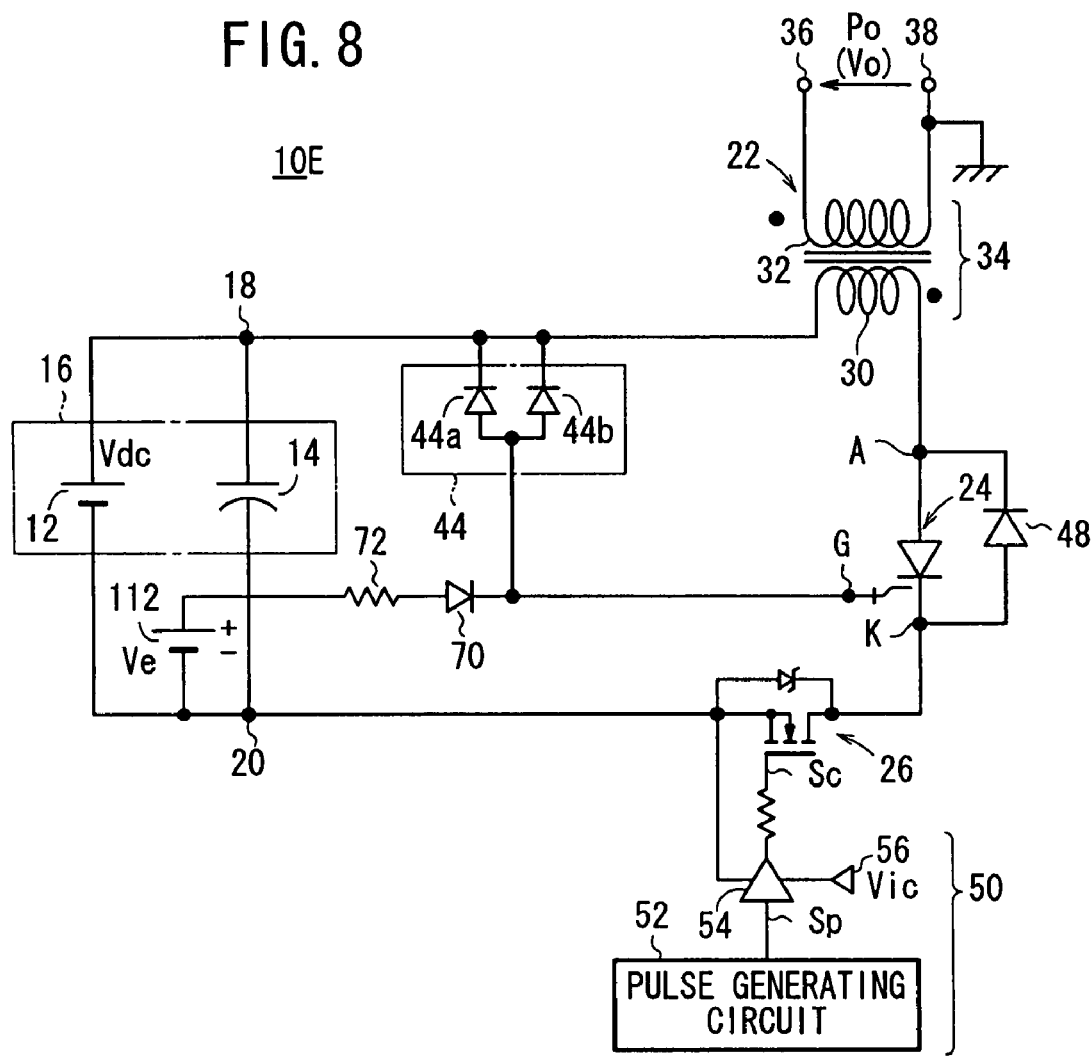
FIG. 8 is a circuit diagram showing an arrangement of a high-voltage pulse generating circuit according to a fifth embodiment of the present invention.

As shown in FIG. 8, the high-voltage pulse generating circuit 10E according to the fifth embodiment has essentially the same arrangement as that of the high-voltage pulse generating circuit 10B according to the second embodiment described above, except that another power supply 112 is connected to the negative terminal 20 of the DC power supply unit 16, and a diode 70 and a resistor 72 are connected between the power supply 112 and the gate terminal G of the first semiconductor switch 24.

The power supply voltage Ve of the power supply 112 may be any desired power supply voltage, regardless of the IC power supply 56, so long as the power supply voltage Ve is lower than the power supply voltage Vdc of the DC power supply unit 16.

A high-voltage pulse generating circuit 10F according to a sixth embodiment shall be described below with reference to FIG. 9.

Figure 9:
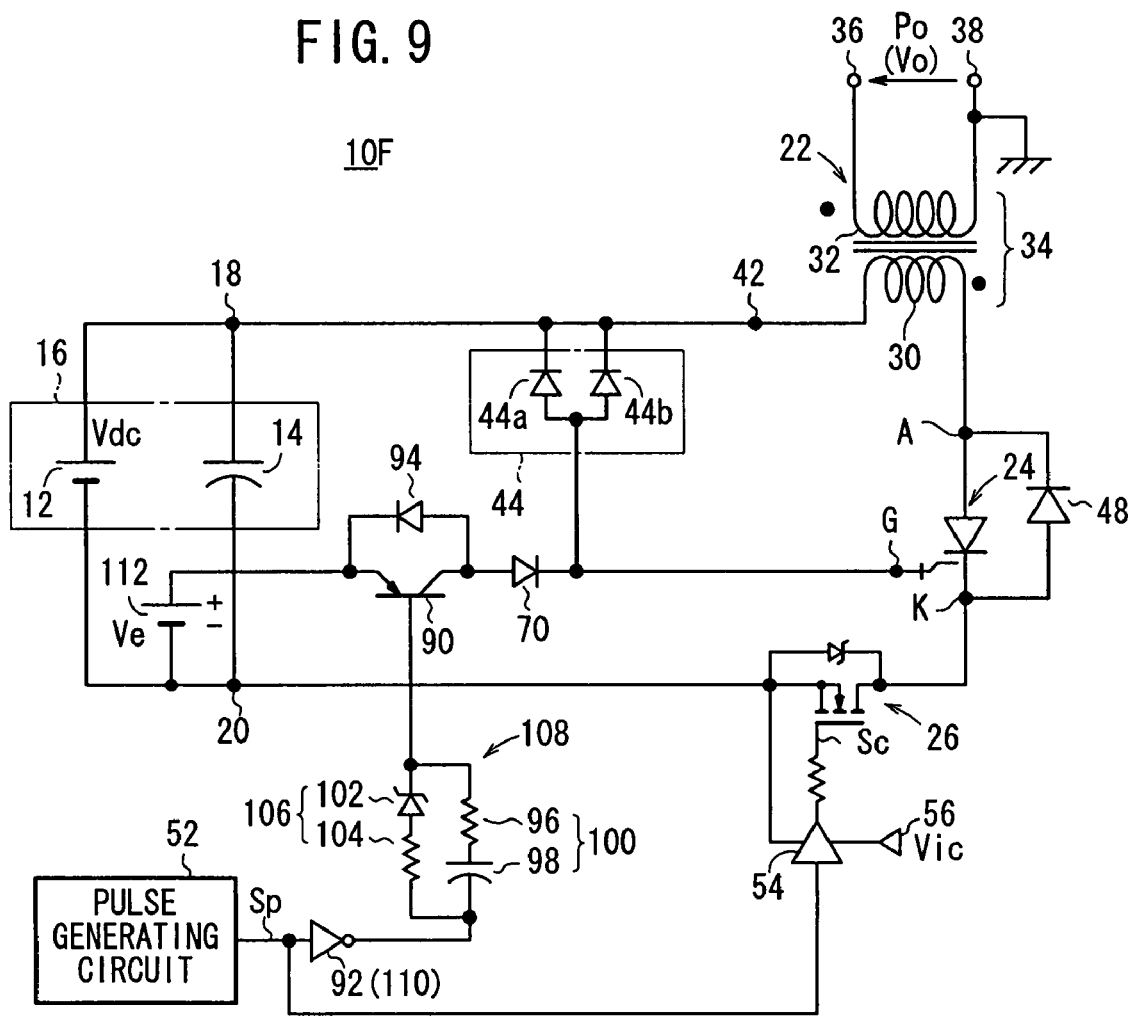
FIG. 9 is a circuit diagram showing an arrangement of a high-voltage pulse generating circuit according to a sixth embodiment of the present invention.
Figure 10:
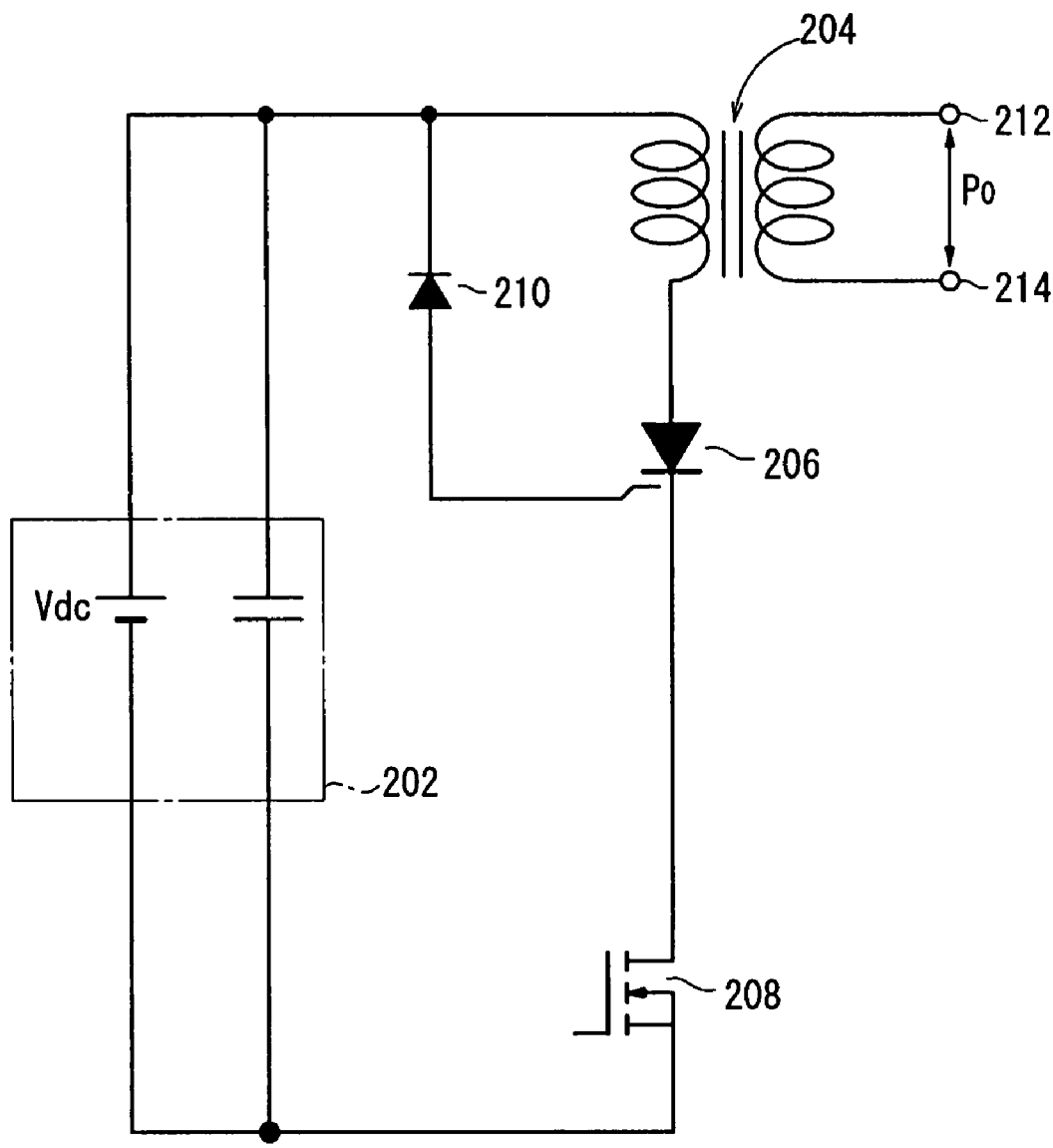
FIG. 10 is a diagram showing a conventional high-voltage pulse generating circuit.
Figure 11:
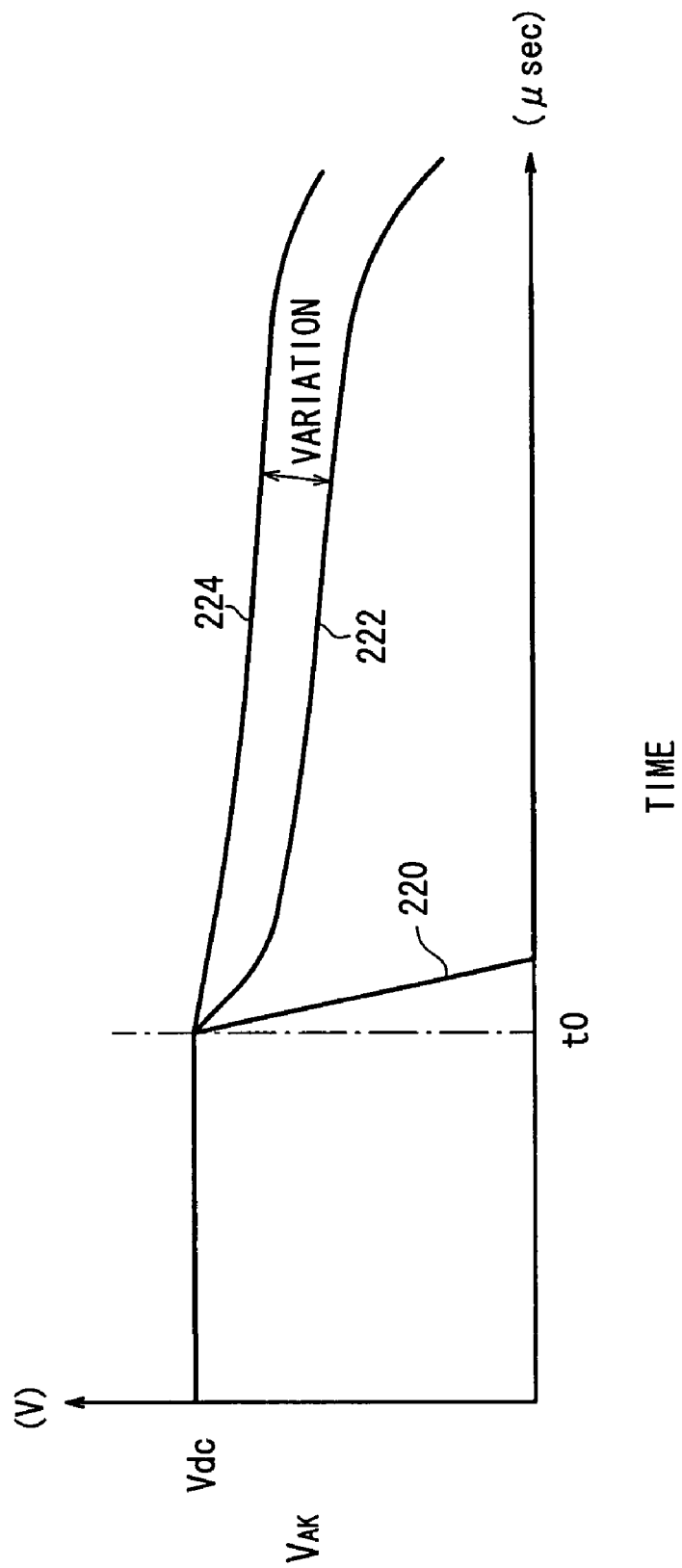
FIG. 11 is a waveform diagram showing a change in the anode-to-cathode voltage of a first semiconductor switch, at a stage in which a second semiconductor switch is turned on, according to the conventional high-voltage pulse generating circuit.

As shown in FIG. 9, the high-voltage pulse generating circuit 10F according to the sixth embodiment has essentially the same arrangement as that of the high-voltage pulse generating circuit 10E according to the fifth embodiment described above, except that a pnp transistor and a diode, which are similar to those of the high-voltage pulse generating circuit according to the fourth embodiment, are connected between the power supply 112 connected to the negative terminal 20 of the DC power supply unit 16 and the gate terminal G of the first semiconductor switch 24. In addition, the high-voltage pulse generating circuit 10F includes a control circuit 92 (an inverter 110 or the like) for turning on the pnp transistor 90 substantially in synchronism with turning on the second semiconductor switch 26. Those parts of the sixth embodiment that correspond to those of the fourth embodiment are denoted by identical reference characters, and shall not be described in detail below.

Substantially simultaneously with the rise of the pulse waveform output from the amplifier 54, a voltage lower than the potential of the emitter terminal of the pnp transistor 90 is applied to the base terminal of the pnp transistor 90. Therefore, the pnp transistor 90 is turned on and supplies the current from the IC power supply 56 as a gate current Ig, further amplified by the pnp transistor 90, to the gate terminal G of the first semiconductor switch 24. In this case, the first semiconductor switch 24 is also quickly shifted so as to assume a turned-on state.

Although not shown, a parallel-connected circuit 82 (a parallel-connected circuit made up of a resistor 72 and a capacitor 80), which is similar to the parallel-connected circuit of the high-voltage pulse generating circuit according to the third embodiment, may be connected between the power supply 112 connected to the negative terminal 20 of the DC power supply unit 16 and the gate terminal G of the first semiconductor switch 24.

The high-voltage pulse generating circuit according to the present invention is not limited to the above embodiments, but may be formed in various other arrangements without deviating from the scope of the invention.

The invention claimed is:

1. A high-voltage pulse generating circuit comprising:
   an inductor, a first semiconductor switch, and a second semiconductor switch, which are connected in series with each other between opposite ends of a DC power supply unit;
   a first diode having a cathode terminal thereof connected to another end of said inductor, said inductor having one end thereof connected to an anode terminal of said first semiconductor switch, and said first diode having an anode terminal thereof connected to a gate terminal of said first semiconductor switch;
   gate current supply means for supplying a gate current to the gate terminal of said first semiconductor switch, based on turning on said second semiconductor switch; and
   another power supply for providing a power supply voltage that is lower than the power supply voltage of said DC power supply unit, wherein
   said gate current supply means comprises a second diode between said another power supply and said gate terminal of said first semiconductor switch, and said second diode has a forward direction oriented from said another power supply toward said gate terminal.

2. A high-voltage pulse generating circuit according to claim 1, wherein said gate current supply means further comprises
   a resistor connected in series with said second diode between said second diode and said another power supply.

3. A high-voltage pulse generating circuit according to claim 1, wherein said gate current supply means further comprises
   a parallel-connected circuit, made up of a resistor and a capacitor, connected in series with said second diode between said second diode and said another power supply.

4. A high-voltage pulse generating circuit according to claim 1, wherein
   said gate current supply means further comprises
   a transistor connected between said second diode and said another power supply; and
   a control circuit for turning on said transistor substantially in synchronism with turning on a second semiconductor switch, for controlling the gate current value thereof.

5. A high-voltage pulse generating circuit according to claim 1, wherein
   said another power supply comprises an IC power supply, which is used by an IC for energizing said second semiconductor switch.

6. A high-voltage pulse generating circuit according to claim 1, wherein
   said DC power supply unit shares a negative terminal with said another power supply unit.

* * * * *